United States Patent
Florence

(10) Patent No.: US 7,961,794 B2
(45) Date of Patent: Jun. 14, 2011

(54) TRANSFER OF DIGITAL DATA THROUGH A TRANSFORMER

(75) Inventor: Arnaud Florence, Saint Antoine du Rocher (FR)

(73) Assignee: STMicroelectronics S.A., Montrouge (FR)

( * ) Notice: Subject to any disclaimer, the term of this patent is extended or adjusted under 35 U.S.C. 154(b) by 868 days.

(21) Appl. No.: 11/900,605

(22) Filed: Sep. 12, 2007

(65) Prior Publication Data

US 2008/0069249 A1    Mar. 20, 2008

(30) Foreign Application Priority Data

Sep. 14, 2006  (FR) ...................... 06 53735

(51) Int. Cl.
*H04B 3/00* (2006.01)
(52) U.S. Cl. ...................... 375/258; 375/259
(58) Field of Classification Search ........... 375/257–259
See application file for complete search history.

(56) References Cited

U.S. PATENT DOCUMENTS

| 4,300,095 | A | * | 11/1981 | Rhodes | 324/255 |
| 5,786,687 | A | * | 7/1998 | Faulk | 323/289 |
| 7,200,014 | B1 | * | 4/2007 | Hawkes et al. | 363/21.1 |
| 2008/0094046 | A1 | * | 4/2008 | Chen et al. | 323/282 |

FOREIGN PATENT DOCUMENTS

| JP | 62 012239 A | 1/1987 |
| JP | 63 237617 A | 10/1988 |
| JP | 2003 204362 A | 7/2003 |

OTHER PUBLICATIONS

French Search Report from French Patent Application 06/53735, filed Sep. 14, 2006.

* cited by examiner

*Primary Examiner* — Emmanuel Bayard
(74) *Attorney, Agent, or Firm* — Lisa K. Jorgensen; James H. Morris; Wolf, Greenfield & Sacks, P.C.

(57) ABSTRACT

A method and a system for transferring a digital signal through a transformer, including a circuit for coding the digital signal to be transferred, having two outputs connected to the respective ends of a primary winding of the transformer, and a circuit for decoding the current in a secondary winding of the transformer generating a rising, respectively falling edge, of an output signal according to the direction of detected current pulses.

16 Claims, 3 Drawing Sheets

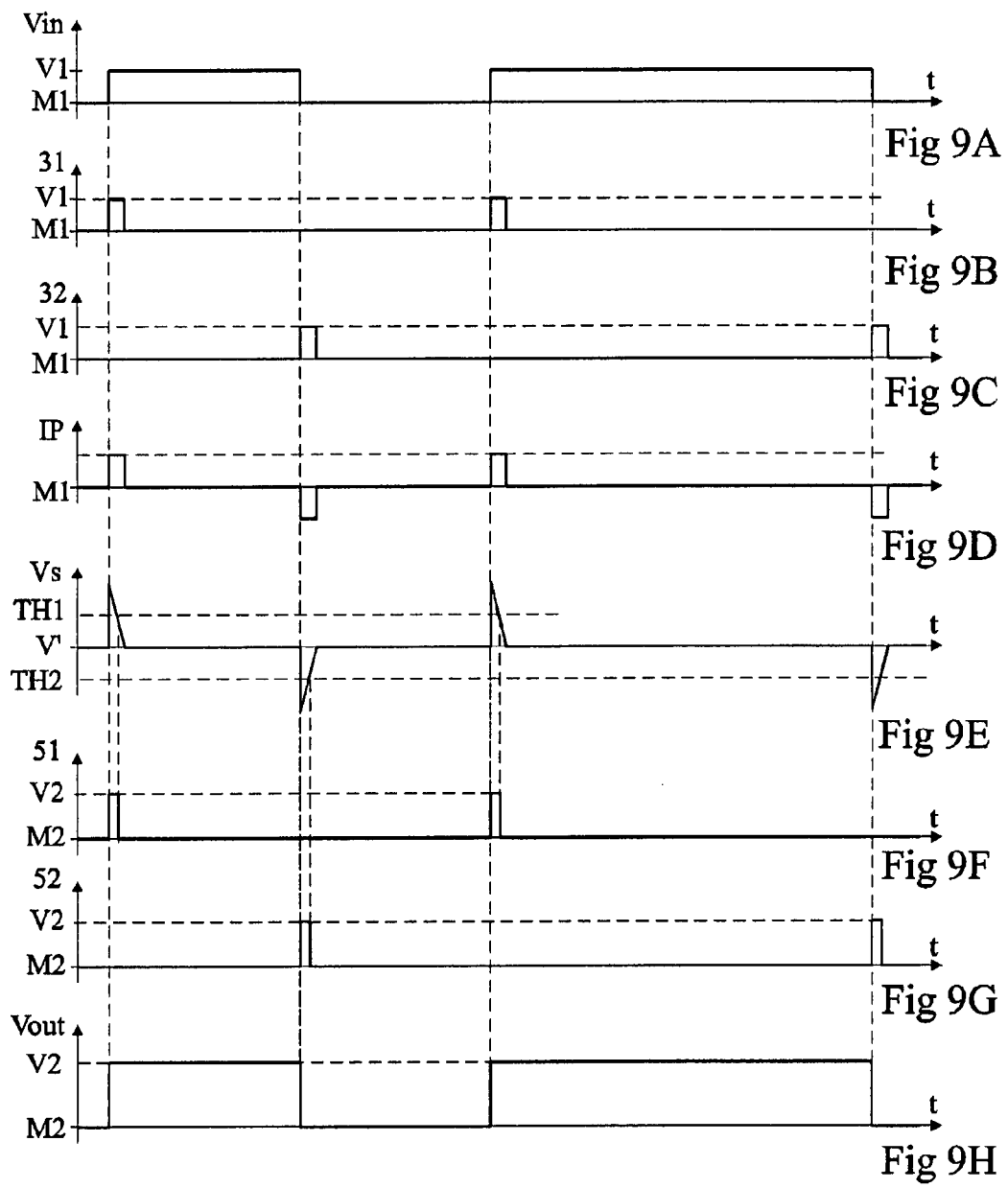

TRANSFER OF DIGITAL DATA THROUGH A TRANSFORMER

BACKGROUND OF THE INVENTION

1. Field of the Invention

The present invention generally relates to galvanic isolation barriers and, more specifically, to the transmission of digital signals through an isolation barrier.

2. Discussion of the Related Art

FIG. 1 is a schematic block diagram illustrating an example of an isolation system or isolator 1 (ISOL) of the type to which the present invention applies. This isolator receives, on an input terminal IN, a digital signal Vin having as an amplitude a first voltage V1 referenced with respect to a first ground M1 and, on an output terminal OUT, a digital signal Vout having as an amplitude a second voltage V2 referenced with respect to a second ground M2. Amplitudes V1 and V2 may be different or identical.

To obtain a galvanic isolation, optocouplers, capacitive couplers, or transformers are generally used.

The present invention more specifically applies to a transformer-based isolation.

FIG. 2 shows a first example of a known diagram of a transformer 11. A primary winding 11p of the transformer receives, on a first end 12, signal Vin to be converted and has its second end 13 connected to ground M1. A second winding 11s of the transformer has a first end 14 defining terminal OUT while a second end 15 is connected to ground M2. A current-to-voltage conversion resistor R, across which signal Vout is sampled, connects output terminals 14 and 15.

FIGS. 3A, 3B, and 3C illustrate the operation of the transformer of FIG. 2 for the transmission of a digital signal Vin (for example, a clock signal). FIG. 3A shows an example of the shape of signal Vin. FIG. 3B illustrates the shape of current Ip in primary 11p of the transformer. FIG. 3C shows the shape of current Is in secondary 11s. The rising edges of signal Vin translate as pulses in a first direction (for example, positive with the orientations taken in the drawings) on current Is. The falling edges translate as pulses in the reverse direction. Based on current Is, an adapted decoder is capable of restoring the clock signal having crossed the isolation barrier.

However, a disadvantage of the assembly of FIG. 2 is that it generates significant power consumption. Indeed, on the primary side, the transformer is powered during all the positive square pulses while only the edges are exploited by the secondary. This useless consumption is illustrated in FIG. 3B by hatchings.

FIG. 4 shows a first example of a solution aiming at avoiding this useless consumption.

Two transformers 11 and 11' are respectively used to transmit rising and falling edges of input signal Vin. For this purpose, input terminal IN of the isolator is sent onto the input of two coding circuits 21 (PCODE) and 22 (NCODE) respectively providing pulses on the rising edges and on the falling edges of signal Vin. The outputs of circuits 21 and 22 are connected to first respective ends 12 and 12' of transformers 11 and 11' having their respective ends 13 and 13' connected to ground M1. Respective ends 14, 15, and 14', 15' of the windings of transformers 11 and 11' are connected to a decoding circuit 23 (DECODE) which provides, on an output terminal OUT, signal Vout referenced with respect to ground M2.

A disadvantage of the isolator of FIG. 4 is that it requires two transformers, which increases the bulk and the cost.

FIG. 5 shows a second example of a solution for avoiding excessive power consumption of the transformer.

According to this example, a circuit 21' (CODE) for coding digital signal Vin to be processed provides, to primary 11p of a transformer 11, a pulse for rising edges and a sequence of two close pulses for falling edges. A decoding circuit 23' (DECODE) exploits, on the secondary side, the edges and edge pairs to restore signal Vout.

A disadvantage of the isolator of FIG. 5 is that it requires, on the decoding side, a determined observation window to be able to make out the rising edges from the pairs of falling edges which translate at the secondary as pulses in the same direction. The frequency of the digital signal to be processed, and thus the system passband, is thus limited.

SUMMARY OF THE INVENTION

At least one embodiment of the present invention aims at overcoming all or part of the disadvantages of known transformers for transferring digital signals through an isolation barrier.

At least one embodiment of the present invention more specifically aims at a solution requiring but a single transformer.

At least one embodiment of the present invention also aims at a solution exploiting simplified coding and decoding circuits.

At least one embodiment of the present invention also aims at a solution with a wide passband.

At least one embodiment of the present invention provides a method for transferring a digital signal through a transformer, in which the current through a primary winding of the transformer is inverted according to the rising or falling edge of the digital signal to be transferred.

According to an embodiment of the present invention, the digital signal to be transferred is coded to generate pulses at each of its edges.

According to an embodiment of the present invention, respective rising and falling edges of an output signal are generated according to the direction of the current in a secondary winding of the transformer.

An embodiment of the present invention also provides a system for transferring a digital signal through a transformer, comprising:

a circuit for coding the digital signal to be transferred, two outputs of which are connected to the respective ends of a primary winding of the transformer; and a circuit for decoding the current in a secondary winding of the transformer generating a rising, respectively, falling edge of an output signal according to the direction of detected current pulses.

According to an embodiment of the present invention, the coding circuit comprises:

a first inverter associated with a first logic gate to generate pulses on the rising edges; and second and third inverters associated with a second logic gate to generate pulses on the falling edges.

According to an embodiment of the present invention, the respective outputs of the first and third inverters are connected to a positive supply line by capacitors.

According to an embodiment of the present invention, the decoding circuit comprises two comparators having their outputs connected to the respective set and reset inputs of a flip-flop having an output providing the transferred digital signal.

The foregoing and other objects, features, and advantages of the present invention will be discussed in detail in the following non-limiting description of specific embodiments in connection with the accompanying drawings.

BRIEF DESCRIPTION OF THE DRAWINGS

FIGS. 9A, 9B, 9C, 9D, 9E, 9F, 9G, and 9H illustrate, in timing diagrams, the operation of the system shown in the foregoing drawings.

DETAILED DESCRIPTION

Figure 1:
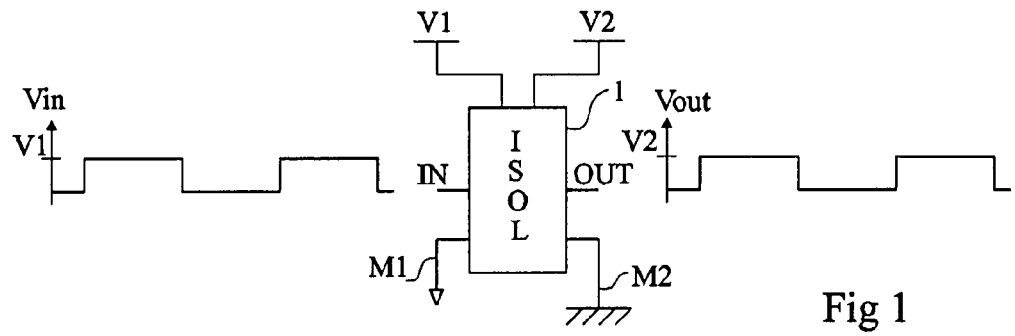
FIGS. 1 to 5, previously described, are intended to show the state of the art and the problem to solve.
Figure 2:
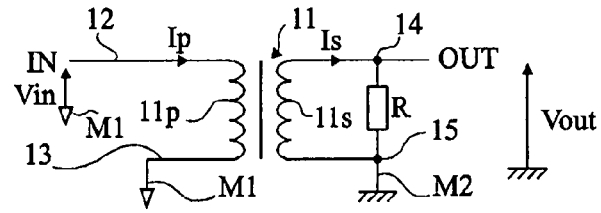
Figure 3A:
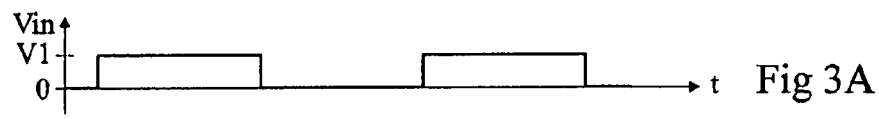
Figure 3B:
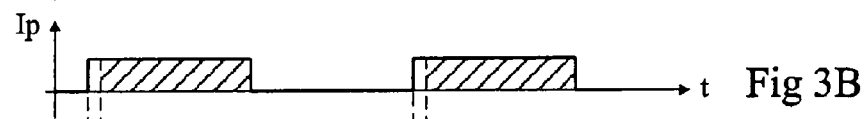
Figure 3C:
Figure 4:
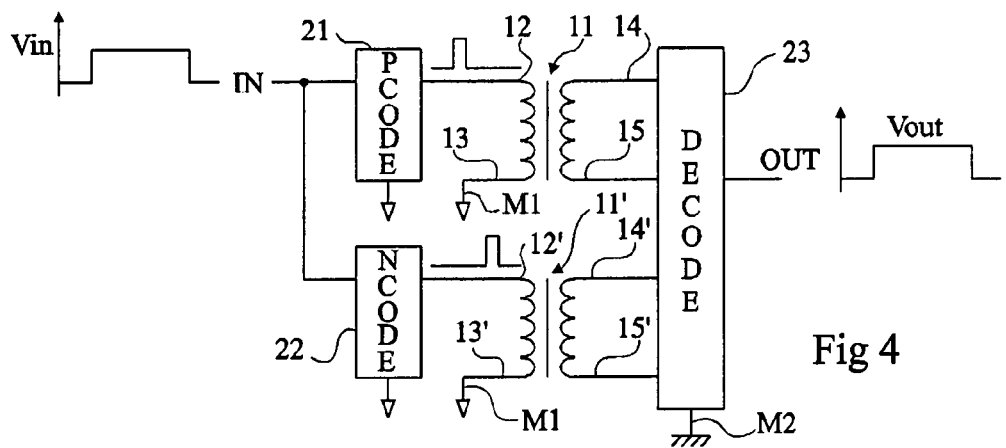
Figure 5:
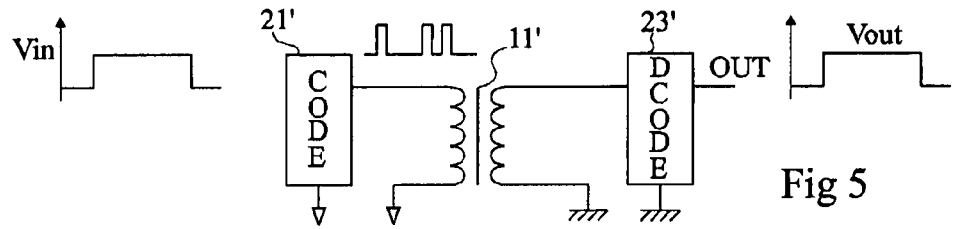

The same elements have been designated with the same reference numerals in the different drawings which have been drawn out of scale. For clarity, only those elements which are useful to the understanding of the present invention have been shown in the drawings and will be described. In particular, the upstream and downstream circuits of the isolation barrier of the present invention, for generating the digital signals and exploiting these signals, have not been described in detail, the present invention being compatible with any conventional system requiring to have a digital signal transit through an isolation barrier.

Figure 6:
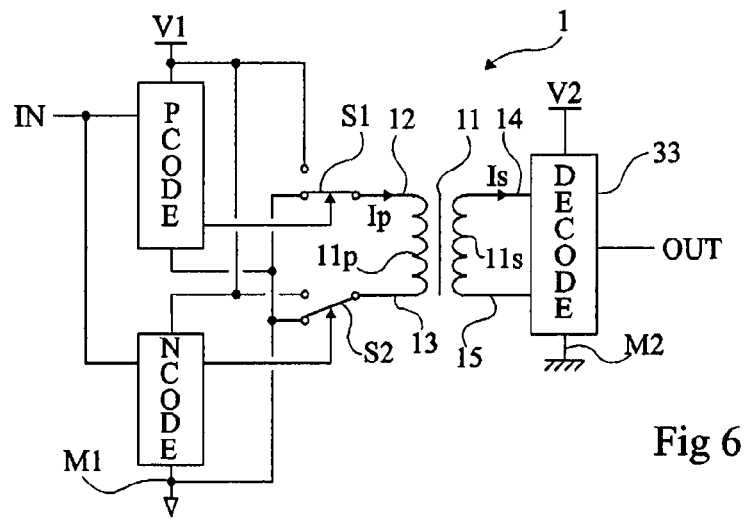
FIG. 6 is a schematic block diagram illustrating a first embodiment of a transfer system according to the present invention.

FIG. 6 is a schematic block diagram illustrating an embodiment of a system of digital signal transfer through an isolation barrier according to the present invention.

An input terminal IN receiving a digital signal Vin to be transmitted downstream of the isolation barrier is connected to the inputs of two coders 31 (PCODE) and 32 (NCODE) providing amplitude pulses V1, referenced to a first ground (or reference voltage) M1, respectively on the rising and falling edges of the input digital signal. Circuits 31 and 32 control two selectors S1 and S2 for connection under control of respective ends 12 and 13 of a primary winding 11p of a transformer 11, either to a positive supply level, or to ground M1. Selector 51 selects voltage V1 in the presence of a pulse representing a rising edge of the input signal and ground M1 otherwise. Similarly, selector S2 selects voltage V1 in the presence of a pulse representing a falling edge of signal Vin and ground M1 otherwise.

Thus, the direction of current Ip in primary 11p of transformer 11 is inverted according to the direction of the edge present on input signal Vin even though circuits 31 and 32 both provide pulses in the same direction (for example, positive) when they detect a respective rising or falling edge.

On the secondary side 11s of the transformer, a decoding circuit 33 (DECODE) provides an output signal on a terminal OUT representing the input digital signal. Decoder 33 regenerates the digital signal by exploiting the respective directions of the pulses present on current Is of secondary winding 11s.

Figure 7:
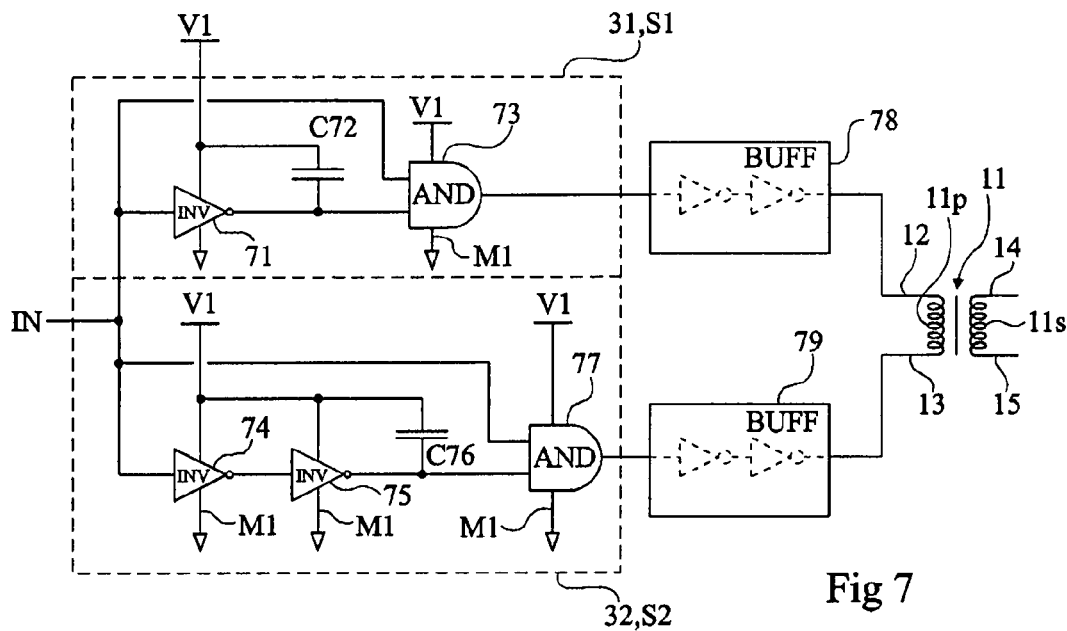
FIG. 7 shows a first embodiment of an input circuit of the system of FIG. 6.

FIG. 7 shows an example of the forming of the input circuit of the system of FIG. 6, based on the use of inverters (for example, CMOS inverters). In this example, circuit 31 is formed of an inverter 71 (INV) supplied with voltage V1. The inverter input (common gates of the P- and N-channel transistors in series between supply lines V1 and M1) is connected to input terminal IN. The inverter output is connected to supply line V1 by a capacitor C72 setting a delay at the inverter turning-on (and thus the duration of the positive pulses on the rising edges). The output of inverter 71 is connected to a first input of a logic AND-type gate 73 having a second input receiving signal IN. Gate 73 in a way defines selector S1.

In the quiescent state (signal Vin at ground M1), the output of inverter 71 is high. The output of gate 73 then is low. When a rising edge reaches input IN, the switching of the output of inverter 71 is delayed by the time taken by capacitor C72 to discharge into the series resistor in the on state of the low transistor of the inverter. Since the second input of gate 73 switches to the high level before discharge of capacitor 72, the output of gate 73 switches to the high level. When capacitor 72 is sufficiently discharged, gate 72 switches back to the low level. As long as signal Vin remains high, the output of inverter 71 provides a low level and gate 73 remains at the low level.

During a falling edge of signal Vin, the switching of inverter 71 to the high level is almost immediate by capacitor C72. Further, this edge reaches the second input of AND gate 73 having its output thus remaining in the low state.

There appears from the foregoing that the value of capacitor C72 is selected to introduce a delay greater than the propagation time of the signal to the second input of gate 73.

An additional gate (not shown) may be interposed between input IN and the second input of gate 73 to form an activation element controlled by a signal applied to the other input of this additional gate.

A similar structure is reproduced on the side of coder 32 and selector S2, with the sole difference that two inverters 74 and 75 are in series between input IN and an AND-type gate 77, a capacitor C76 connecting the output of second inverter 75 to voltage V1. The output of gate 77 provides positive pulses on the falling edges of input signal IN.

An advantage of this embodiment is its simplicity to alternate the direction of the excitation pulses of the transformer.

The output signals of gates 73 and 77 can be amplified by buffers 78 and 79 (BUFF) formed, for example, of several inverters in series (with a same number of inverters in circuits 78 and 79) to increase the current provided to primary winding 11p to make the transfer system faster.

Figure 8:
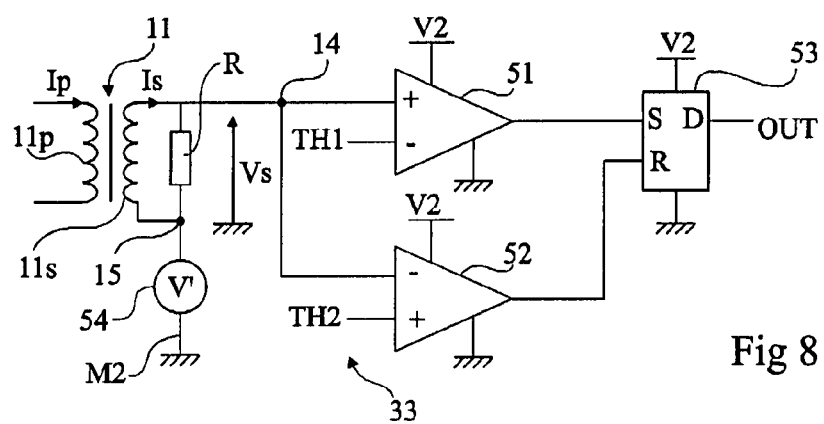
FIG. 8 shows an embodiment of an output circuit of the system of FIG. 6.

FIG. 8 shows an embodiment of a decoder 33 of the current Is provided by secondary 11s of transformer 11. This decoder is based on the use of two comparators 51 and 52 having their respective non-inverting and inverting inputs connected to terminal 14 of secondary winding 11s of transistor 11. A current-to-voltage conversion resistor R connects terminals 14 and 15. The respective inverting and non-inverting inputs of comparators 51 and 52 receive threshold voltages TH1 and TH2. Levels TH1 and TH2 may be identical or slightly different and then introduce a hysteresis favorable to an immunity to noise. Levels TH1 and TH2 are selected to be crossed each time a pulse representative of a pulse is present on the secondary current and to filter possible spurious noise. The output of first comparator 51 is connected to a first input (for example, S for setting to 1) of a flip-flop 53 having its second input (reset R) connected to the output of comparator 52. Output D of the RS flip-flop forms output OUT of the isolator. The comparators and the flip-flop are supplied with voltage V2.

Preferably and as illustrated in FIG. 8, a voltage regulator 54 is interposed between terminal 15 of the secondary winding and ground M2 to shift the reference of node 15 by a voltage V' with respect to ground M2, so that voltage Vs between terminal 14 and ground M2 remains positive.

FIGS. 9A to 9H illustrate, in timing diagrams, the operation of the system of FIGS. 6 to 8.

FIG. 9A shows an example of a digital signal Vin applied to the system input. In this arbitrary example, the signal is not a clock signal but a digital signal, for example, a data transmission signal.

FIG. 9B illustrates the shape of the signal provided by coder 31 which exhibits a pulse of level V1 on each rising edge of signal Vin. The duration of the pulse depends on the time constant introduced by capacitor C72 and on the on-state series resistance of the low transistor of inverter 71. To simplify the description, the voltage drops with respect to the respective supply voltages of the primary and of the secondary have been neglected and the digital signals are considered as having the full amplitudes of these supply voltages. Similarly, the propagation times of the signals have been neglected.

FIG. 9C shows the course of the signal provided at the output of coder 32 which comprises a positive pulse of level V1 on each falling edge of signal Vin. For a given inverter technology, the duration of the pulse depends on the value of capacitor C76. Preferably, capacitors C72 and C76 are selected to have the same value.

FIG. 9D illustrates the course of current Ip in the primary of transformer 11. Due to the inversion of the ground connection of this primary winding, the output pulses of coder 31 translate as positive pulses with orientations taken in the drawings while the pulses present at the output of coder 32 translate as negative pulses.

FIG. 9E illustrates the shape of voltage Vs recovered on the secondary side of the transformer. A positive pulse with respect to level V' is present for each positive pulse of current Ip and a negative voltage with respect to level V' is present for each negative pulse of current Ip.

FIG. 9F shows the shape of the output signal of comparator 51 which exhibits a positive pulse of amplitude V2 while voltage Vs is greater than threshold TH1.

FIG. 9G shows the shape of the output signal of comparator 52 which exhibits a positive pulse of amplitude V2 while voltage Vs is lower than threshold TH2.

FIG. 9H shows the shape of signal Vout at the output of flip-flop 53.

An advantage of the present invention is that a single transformer is sufficient to perform the galvanic isolation.

Another advantage is that the isolation barrier is not limited to an observation window to distinguish successive edges. Each pulse present on the output signal represents an edge in the inverse direction with respect to the preceding edge, thus simplifying the decoding system.

Of course, the present invention is likely to have various alterations, modifications, and improvements which will readily occur to those skilled in the art. In particular, the sizing of the different used components according to the application is within the abilities of those skilled in the art based on the functional indications given hereabove.

Further, other coding circuits may be provided. For example, gates 73 and 77 may be replaced with NAND-type gates if circuits 78 and 79 comprise odd numbers of inverters. According to another variation, capacitors C72 and C76 are omitted and replaced by a propagation delay (for example, by means of series inverters) of the signals provided on the first inputs of gates 73 and 77 with respect to signal Vin provided on their second inputs.

Such alterations, modifications, and improvements are intended to be part of this disclosure, and are intended to be within the spirit and the scope of the present invention.

Accordingly, the foregoing description is by way of example only and is not intended to be limiting. The present invention is limited only as defined in the following claims and the equivalents thereto.

What is claimed is:

1. A method comprising:
   transferring a signal through a transformer by applying power to the transformer, wherein power is applied in a first direction through a primary winding of the transformer to indicate a rising edge of the signal to be transferred and power is applied in a second direction through the primary winding to indicate falling edge of the signal to be transferred, the second direction being different from the first direction.

2. The method of claim 1, wherein the signal to be transferred is coded to generate pulses at each of its edges.

3. The method of claim 1, further comprising generating respective rising and falling edges of an output signal according to the direction of the power in a secondary winding of the transformer.

4. A system for transferring a signal through a transformer, comprising:
   a first circuit for coding the signal to be transferred, the first circuit comprising a first output connected to a first end of a primary winding of the transformer and a second output connected to a second end of the primary winding of the transformer, the first circuit outputting power from the first output to indicate a rising edge of the signal and outputting power from the second output to indicate a falling edge of the signal; and
   a second circuit for decoding power in a secondary winding of the transformer, the second circuit generating an output signal according to the direction of pulses detected in the secondary winding.

5. The system of claim 4, wherein the first circuit comprises:
   a first inverter associated with a first logic gate to generate pulses on the first output to indicate rising edges of the signal; and
   second and third inverters associated with a second logic gate to generate pulses on the second output to indicate falling edges of the signal.

6. The system of claim 5, wherein the respective outputs of the first and third inverters are connected to a positive supply line by capacitors.

7. The system of claim 4, wherein the second circuit comprises two comparators having their outputs connected to the respective set and reset inputs of a flip-flop having an output providing the transferred signal.

8. The system of claim 4, wherein the circuit for decoding the signal includes two comparators having outputs connected to respective set and reset inputs of a flip-flop having an output providing the decoded signal.

9. A method for transferring a signal through a transformer, the method comprising:
   receiving a signal including pulses having rising edges and falling edges;
   coding the signal into first coded signal with coded pulses corresponding to rising and falling edges of the pulses in the signal;
   transferring coded pulses corresponding to the rising edges in a first direction through a primary winding of the transformer; and
   transferring coded pulses corresponding to the falling edges in a second direction, opposite to the first direction, through the primary winding of the transformer.

10. The method of claim 9, further comprising:
receiving a second coded signal at a secondary winding of the transformer, the second coded signal including pulses of a first polarity corresponding to rising edges of the coded pulses in the first coded signal and pulses of a second polarity, opposite to the first polarity, corresponding to falling edges of the coded pulses in the first coded signal.

11. The method of claim 10, further comprising:
recovering the signal by converting the pulses of the first polarity into rising edges of pulses in a decoded signal and by converting the pulses of the second polarity into falling edges of the pulses in the decoded signal.

12. The method of claim 9, wherein transferring coded pulses corresponding to rising edges and transferring coded pulses corresponding to falling edges occurs in a single transformer through galvanic isolation.

13. A system for transferring a signal through a transformer, comprising:
a circuit for coding pulses of the signal to be transferred into a first output corresponding to a rising edge of the pulses to a first end of a primary winding of the transformer and for coding pulses of the signal to be transferred into a second output corresponding to a falling edge of the pulses to a second end of the primary winding of the transformer; and
a circuit for decoding a signal received at a secondary winding of the transformer to generate a decoded signal that includes rising edges corresponding to coded pulses received by the first end of the primary winding and falling edges corresponding to coded pulses received by the second end of the primary winding.

14. The system of claim 13, including the transformer.

15. The system of claim 13, wherein the circuit for coding pulses includes:
a first inverter associated with a first logic gate to generate pulses on the rising edges; and
second and third inverters associated with a second logic gate to generate pulses on the falling edges.

16. The system of claim 15, wherein outputs of each of the first and third inverters is connected to a positive supply line through a capacitor.

* * * * *